(12) United States Patent
Cohen et al.

(10) Patent No.: US 7,596,771 B2
(45) Date of Patent: Sep. 29, 2009

(54) DISTRIBUTED ELEMENT GENERATOR, METHOD OF GENERATING DISTRIBUTED ELEMENTS AND AN ELECTRONIC DESIGN AUTOMATION TOOL EMPLOYING THE SAME

(75) Inventors: Isaac D. Cohen, Richardson, TX (US); Sergey F. Komarov, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/125,437

(22) Filed: May 10, 2005

(65) Prior Publication Data
US 2006/0259883 A1    Nov. 16, 2006

(51) Int. Cl.
*G06F 9/45*    (2006.01)
*G06F 9/455*   (2006.01)

(52) U.S. Cl. .............................. 716/5; 716/11
(58) Field of Classification Search ............. 716/5, 716/11–12
See application file for complete search history.

(56) References Cited

U.S. PATENT DOCUMENTS

| | | | |
|---|---|---|---|
| 6,438,729 B1 * | 8/2002 | Ho | 716/1 |
| 6,588,002 B1 * | 7/2003 | Lampaert et al. | 716/8 |
| 2002/0104063 A1 * | 8/2002 | Chang et al. | 716/4 |
| 2003/0069722 A1 * | 4/2003 | Beattie et al. | 703/14 |
| 2003/0101418 A1 * | 5/2003 | Draxler et al. | 716/1 |
| 2003/0237063 A1 * | 12/2003 | Kauth et al. | 716/5 |
| 2004/0049747 A1 * | 3/2004 | Yamasaki et al. | 716/4 |

* cited by examiner

*Primary Examiner*—Jack Chiang
*Assistant Examiner*—Suresh Memula
(74) *Attorney, Agent, or Firm*—Warren L. Franz; Wade J. Brady, III; Frederick J. Telecky, Jr.

(57) ABSTRACT

The present invention provides a distributed element generator for use with an electronic design automation tool. In one embodiment, the distributed element generator includes a parasitic element extractor configured to identify parasitic elements associated with a passive integrated circuit device having a surrounding layout environment. Additionally, the distributed element generator also includes a distributed parameter allocator coupled to the parasitic element extractor and configured to provide a distributed model of the passive integrated circuit device and allocate the parasitic elements within the distributed model based on the surrounding layout environment.

41 Claims, 4 Drawing Sheets

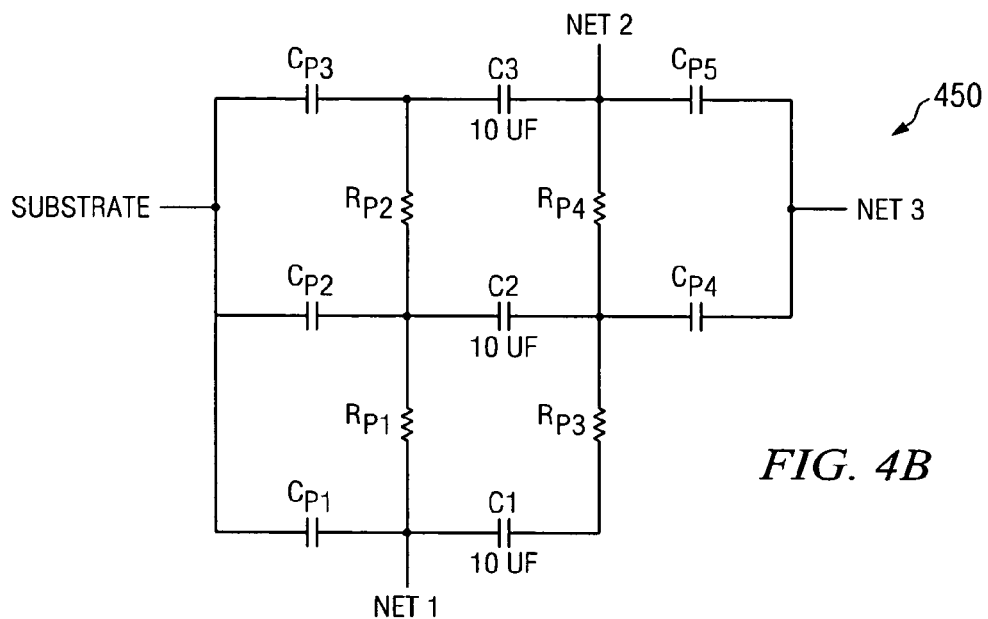
FIG. 4B
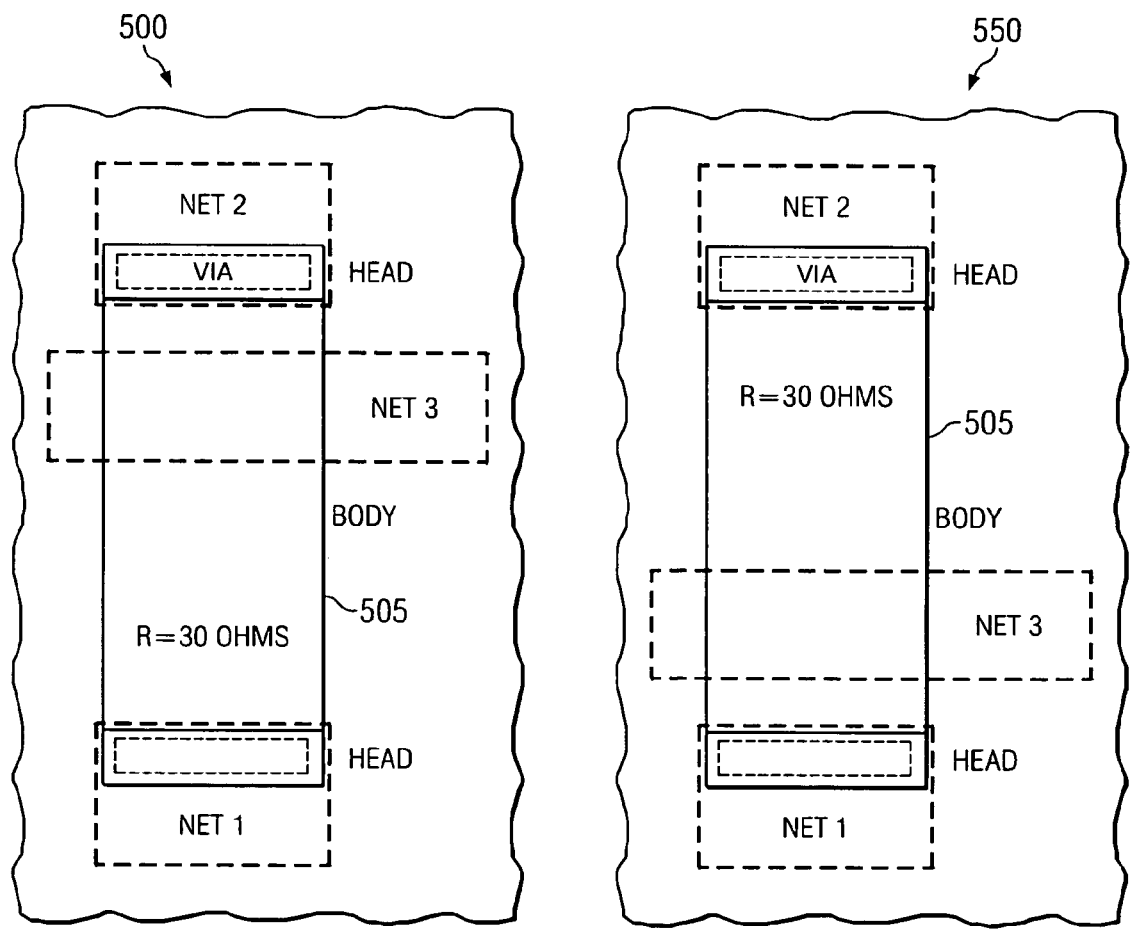
FIG. 5A
FIG. 5B

DISTRIBUTED ELEMENT GENERATOR, METHOD OF GENERATING DISTRIBUTED ELEMENTS AND AN ELECTRONIC DESIGN AUTOMATION TOOL EMPLOYING THE SAME

TECHNICAL FIELD OF THE INVENTION

The present invention is directed, in general, to electronic design automation and, more specifically, to a distributed element generator, a method of generating distributed elements and an electronic design automation tool employing the generator or the method.

BACKGROUND OF THE INVENTION

The product development cycle is under constant pressure to decrease cycle time by moving more quickly from the design phase to properly functioning hardware. The integration of test equipment and electronic design automation and simulation tools typically provides an improvement in product development cycle times. Current models for semiconductor devices do not take into account all of the parasitic elements associated with the way the devices are physically drawn, positioned, and connected.

To address this issue there is a set of electronic design automation tools referred to as "parasitic extractors" that can measure and provide this information for simulation purposes. Current parasitic extractors accurately extract parasitic devices between interconnections but depend on device models for the design devices. The device models may contain accurate parasitic information for the device itself, but do not account for the interactions afforded by its surroundings since its environment is usually unique and therefore not known at the time that the models were developed.

These tools currently deal with this problem by lumping all device parasitic elements together and assigning them to the terminals of the device. This approach provides an approximation to the reality of the silicon layout and can turn out to be a bad approximation, especially as device operating frequencies increase. This is particularly true in devices that are physically large. These devices encounter a higher level of interaction with surrounding devices and interconnections wherein much of the interaction is typically located in the body of the device and not at its terminals, as the current tools assume.

Accordingly, what is needed in the art is an enhanced way to account for the parasitic elements associated with devices embedded in a network.

SUMMARY OF THE INVENTION

To address the above-discussed deficiencies of the prior art, the present invention provides a distributed element generator for use with an electronic design automation tool. In one embodiment, the distributed element generator includes a parasitic element extractor configured to identify parasitic elements associated with a passive integrated circuit device having a surrounding layout environment. Additionally, the distributed element generator also includes a distributed parameter allocator coupled to the parasitic element extractor and configured to provide a distributed model of the passive integrated circuit device and allocate the parasitic elements within the distributed model based on the surrounding layout environment.

In another aspect, the present invention provides a method of generating distributed elements for use with an electronic design automation tool. The method includes identifying parasitic elements associated with a passive integrated circuit device having a surrounding layout environment, providing a distributed model of the passive integrated circuit device and allocating the parasitic elements within the distributed model based on the surrounding layout environment.

The present invention also provides, in yet another aspect, an electronic design automation tool. The electronic design automation tool includes a layout versus schematic module and a resistance-capacitance extraction module that is coupled to the layout versus schematic module. The electronic design automation tool also includes a distributed element generator that is coupled to the resistance-capacitance extraction module. The distributed element generator has a parasitic element extractor that identifies parasitic elements associated with a passive integrated circuit device having a surrounding layout environment and a distributed parameter allocator, coupled to the parasitic element extractor, that provides a distributed model of the passive integrated circuit device and allocates the parasitic elements within the distributed model based on the surrounding layout environment.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which:

FIGS. 4A and 4B illustrate a capacitor layout structure and an embodiment of a corresponding distributed parasitic network representing a distributed model constructed in accordance with the principles of the present invention;

FIGS. 5A and 5B illustrate first and second resistor layout structures having an interconnect crossing located in different positions thereby creating different leakage current profiles;

DETAILED DESCRIPTION

Figure 1:
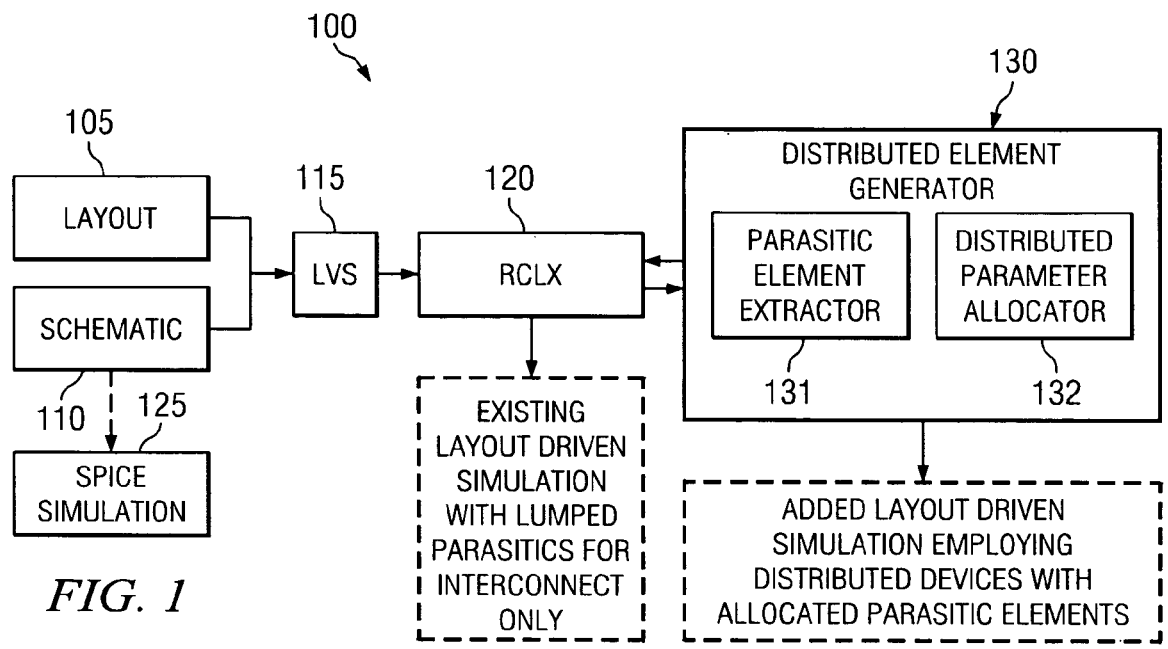
FIG. 1 illustrates a block diagram of an embodiment of an electronic design automation tool constructed in accordance with the principles of the present invention.

Referring initially to FIG. 1, illustrated is a block diagram of an embodiment of an electronic design automation tool, generally designated 100, constructed in accordance with the principles of the present invention. The electronic design automation tool 100 includes a layout module 105, a schematic module 110, a layout versus schematic (LVS) module 115, a resistance-capacitance-inductance extraction (RCLX) module 120, a Simulation Program with Integrated Circuit Emphasis (SPICE) module 125 and a distributed element generator 130.

In the illustrated embodiment, the layout module 105, the schematic module 110, the LVS module 115 and the RCLX module 120 are existing modules as may be associated with an existing electronic design automation tool (e.g., Assura RCX, a Cadence tool). The layout and schematic modules 105, 110 provide layout and schematic information specific to a particular integrated circuit. The LVS module 115 verifies that the layout represents the schematic, and the RCLX module 120 is employed to extract lumped parasitic quantities associated with interconnects only. The SPICE module 125 is also an existing module that provides simulation capabilities for performance verification of the particular integrated circuit.

The RCLX module 120 accounts for interactions between integrated circuit components. However, the RCLX module 120 provides only a coarse approximation to these interactions since integrated circuit components are treated as black boxes wherein many of the interactions to their surrounding layout environments are not appropriately taken into account. For example, the RCLX module 120 assigns a parasitic capacitance associated with the body of an integrated circuit component to its nearest head, thereby affording what is often a worst-case approximation, especially at higher frequencies.

The SPICE module 125 also does not accurately assign parasitic elements. For example, the SPICE module 125 also assumes that all parasitic capacitance is associated with the heads of a resistor. This is again a worst-case approximation, particularly for large resistors connected to critical nodes. Additionally, the models do not account for the parasitic capacitance to actual network connections that may be going over or near the resistor body since the placement of the resistor is not modeled. Additionally, these models do not account for shielding effects of metal and diffusions that may be above or below the resistor and assume that all parasitic capacitance is connected to the substrate, which is typically operated at ground potential.

The distributed element generator 130 includes a parasitic element extractor 131 and a distributed parameter allocator 132. The parasitic element extractor 131 is configured to identify parasitic elements associated with a passive integrated circuit device having a surrounding layout environment. Additionally, the distributed parameter allocator 132 is coupled to the parasitic element extractor 131 and is configured to provide a distributed model of the passive integrated circuit device and allocate the parasitic elements within the distributed model based on the surrounding layout environment. In the illustrated embodiment, the distributed element generator 130 performs as an extension to the RCLX module 120. In alternative embodiments, the distributed element generator 130 may be configured to operate independently or, alternatively, may be incorporated into existing modules as appropriate to particular applications.

In order to describe a circuit for accurate simulation, designed devices must be extracted based on their physical geometry and location and not as a black box dropped into a circuit. The distributed element generator 130 allows for passive designed devices (e.g., resistors, capacitors, inductors and pairs of mutually-coupled inductors) to be extracted at the same time as the interconnect. This action ensures that all circuit interactions to the passive designed devices are identified and simulated in a more realistic fashion.

The distributed element generator 130 first extracts the passive designed device as a black box device and then replaces it with extracted information. This maintains all of the necessary device and electric network naming information and makes viewing and comparing simulation data straightforward and convenient, thereby avoiding workarounds or renaming. The distributed element generator 130 accomplishes this seamlessly by altering the input and output data that the existing electronic design automation tool uses and creates, thereby extending its functionality.

Figure 2A:
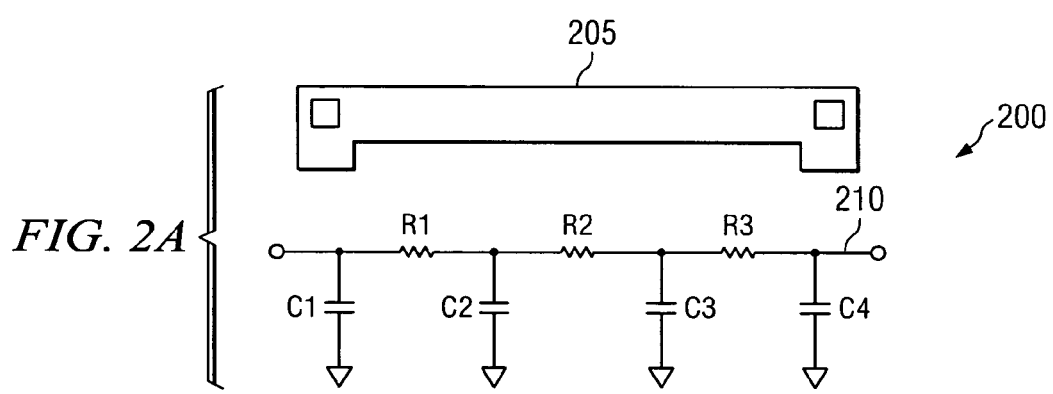
FIGS. 2A and 2B illustrate embodiments of distributed models constructed in accordance with the principles of the present invention.
Figure 2B:
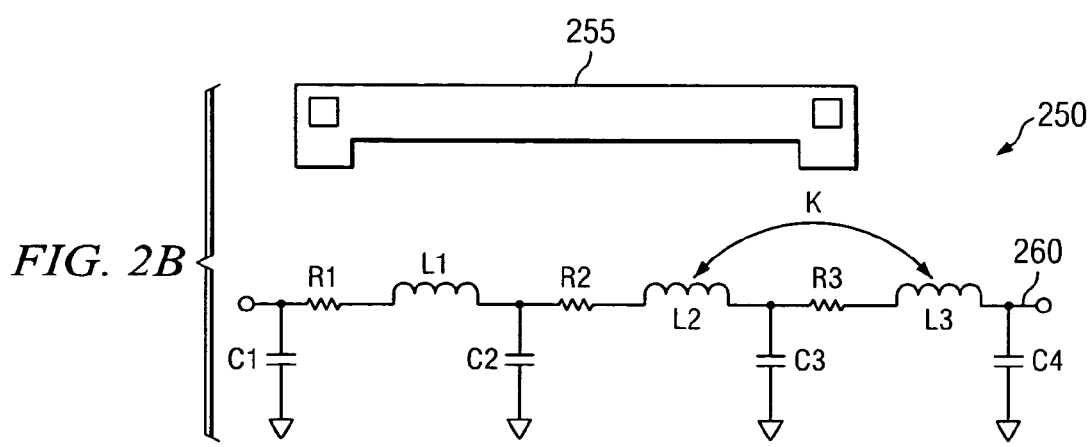

Turning now to FIGS. 2A and 2B, illustrated are embodiments of distributed models, generally designated 200, 250, constructed in accordance with the principles of the present invention. The distributed model 200 includes a representative interconnect 205 and a corresponding distributed interconnect network 210. The representative interconnect 205 provides a parametric representation of a design device, such as a resistor, that has been replaced with extracted information, as was discussed with respect to FIG. 1. The representative interconnect 205 is a "lossy interconnect" that employs a resistivity corresponding to the resistance of the design device resistor. The representative interconnect 205 is divided into three segments, wherein the number of segments is based on a requirement for simulation accuracy.

The distributed interconnect network 210 is an embodiment of a ladder network having series-coupled resistance and parallel-coupled capacitance. The distributed interconnect network 210 includes first, second and third distributed resistances R1, R2, R3 that correspond to each of the three segments of the representative interconnect 205. The summation of the resistances of the first, second and third distributed resistances R1, R2, R3 equals the resistance of the design device resistor. In the illustrated embodiment of FIG. 2A, the first, second and third distributed resistances R1, R2, R3 are equal, corresponding to the three segments having equal areas. Of course, other embodiments may employ a different number of resistances or differing resistances corresponding to a different number of segments or segments having differing areas as appropriate to a particular simulation.

The distributed interconnect network 210 also includes first, second, third and fourth parasitic capacitances C1, C2, C3, C4. As may be seen in FIG. 2A, the first, second, third and fourth parasitic capacitances C1, C2, C3, C4 are distributed, thereby providing for a more accurate simulation for the design device resistor than would parasitic capacitance that has been lumped together. Additionally, the first, second, third and fourth parasitic capacitances C1, C2, C3, C4 may employ equal values of capacitance or they may have differing values as appropriate to the design device resistor and its surrounding layout environment.

Alternatively the ladder network having series-coupled resistances and parallel-coupled capacitances may represent a design device capacitor. For this embodiment, the distributed interconnect network 210 includes first, second, third and fourth distributed capacitances C1, C2, C3, C4 that represent the design device capacitor. The distributed interconnect network 210 also includes first, second and third parasitic resistances R1, R2, R3. In the design device resistor representation, the distributed resistance values are typically much larger than the parasitic resistance values for the design device capacitor representation. Correspondingly, in the design device capacitor representation, the distributed capacitance values are typically much larger than the parasitic capacitance values for the design device resistor representation.

The distributed model 250 includes a representative interconnect 255 and a corresponding distributed interconnect network 260. The representative interconnect 255 also provides a parametric representation of a design device that has been replaced with extracted information. The representative interconnect 255 is again divided into three equal segments wherein this may also be modified as appropriate to a particular requirement for simulation accuracy.

The distributed interconnect network 260 illustrates an embodiment employing a ladder network that incorporates multiple resistances R1, R2, R3, multiple capacitances C1, C2, C3, C4 and both multiple separate inductances L1, L2, L3 and a mutually-coupled inductance K. The multiple resistances R1, R2, R3 and multiple capacitances C1, C2, C3, C4 may represent a design device resistor and parasitic capacitances or a design device capacitor and parasitic resistances as discussed above. The multiple separate inductances L1, L2, L3 and mutually-coupled inductance K are series-coupled and may represent a design device inductor having a mutual inductance or a parasitic inductance having a mutual inductance. In an alternative embodiment, inductances having similar representations that are parallel-coupled may be employed in parallel with the multiple capacitances C1, C2, C3, C4.

Design device inductors typically work by combining the inductance of a conductor along with the inductance of other pieces of the same conductor in order to create a multiplying effect. In order to accurately model the device, this inductance is measured as well as a mutual inductance to nearby conductors. Due to the inherent nature of inductance, the inductance is generated in the area surrounding the drawn device and not just in the device itself. As a consequence, a surrounding layout environment of the inductor device may alter the function and frequency response of that inductor device, sometimes drastically.

Figure 3A:
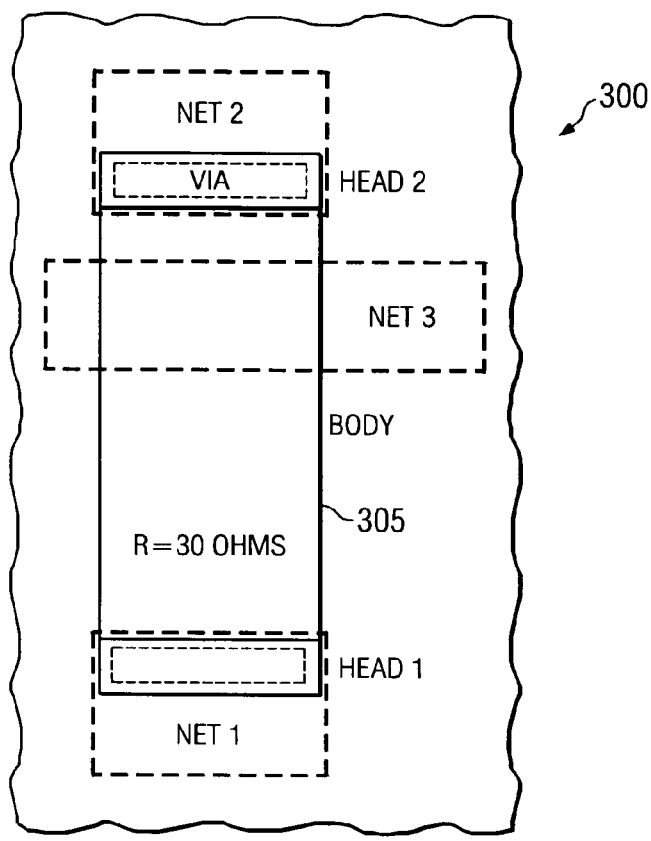
FIGS. 3A and 3B illustrate a resistor layout structure and an embodiment of a corresponding distributed parasitic network representing a distributed model constructed in accordance with the principles of the present invention.
Figure 3B:
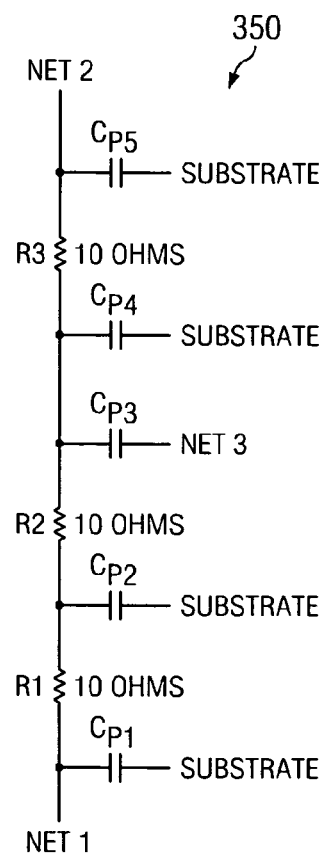

Turning now to FIGS. 3A and 3B, illustrated are a resistor layout structure and an embodiment of a corresponding distributed parasitic network representing a distributed model, generally designated 300, 350, constructed in accordance with the principles of the present invention. The resistor layout structure 300 includes a design device resistor 305 employing first and second resistor heads HEAD1, HEAD2 and first, second and third network connections NET1, NET2, NET3 that are fabricated on a substrate. The first resistor head HEAD1 is connected to the first network connection NET1 employing a via, and the second resistor head HEAD2 is connected to the second network connection NET2 employing another via. The third network connection NET3 does not directly connect to the design device resistor 305 but forms part of its surrounding layout environment wherein it crosses the design device resistor 305 asymmetrically and nearer to the second network connection NET2.

The distributed parasitic network 350 corresponds to a distributed model having allocated parasitic elements as may be provided by a distributed element generator or a method of generating distributed elements. The distributed parasitic network 350 includes first, second and third distributed resistances R1, R2, R3, and first, second, third, fourth and fifth parasitic capacitances $C_{P1}$, $C_{P2}$, $C_{P3}$, $C_{P4}$, $C_{P5}$. In the illustrated embodiment, the first, second and third distributed resistances R1, R2, R3 have equal values whose sum corresponds to the resistance of the design device resistor 305.

The first and fifth parasitic capacitances $C_{P1}$, $C_{P5}$ are connected between the substrate and the first and second resistor heads HEAD1, HEAD2, which also connects them to the first and second network connections NET1, NET2, respectively. The second and fourth parasitic capacitances $C_{P2}$, $C_{P4}$ are respectively connected between the substrate and each end of the second distributed resistor R2, as shown. This arrangement provides a symmetrically distributed network corresponding to a design device resistor that is isolated from additional network influences. Connection of the third parasitic capacitance $C_{P3}$ between the appropriate end of the second distributed resistor R2 and the third network connection NET3 accounts for its influence on the design device resistor 305, which may be quite significant.

In the illustrated embodiment, the first and fifth parasitic capacitances $C_{P1}$, $C_{P5}$ may employ a same value of capacitance and the second and fourth parasitic capacitances $C_{P2}$, $C_{P4}$ may employ another same value of capacitance. However, the third parasitic capacitance $C_{P3}$ may typically employ yet another capacitance value that is greater that the others due to the strong influence that the third network connection NET3 exerts on the design device resistor 305. The distributed modeling afforded by various embodiments of the distributed parasitic network 350 allows a more accurate simulation of the design device resistor 305.

Figure 4A:
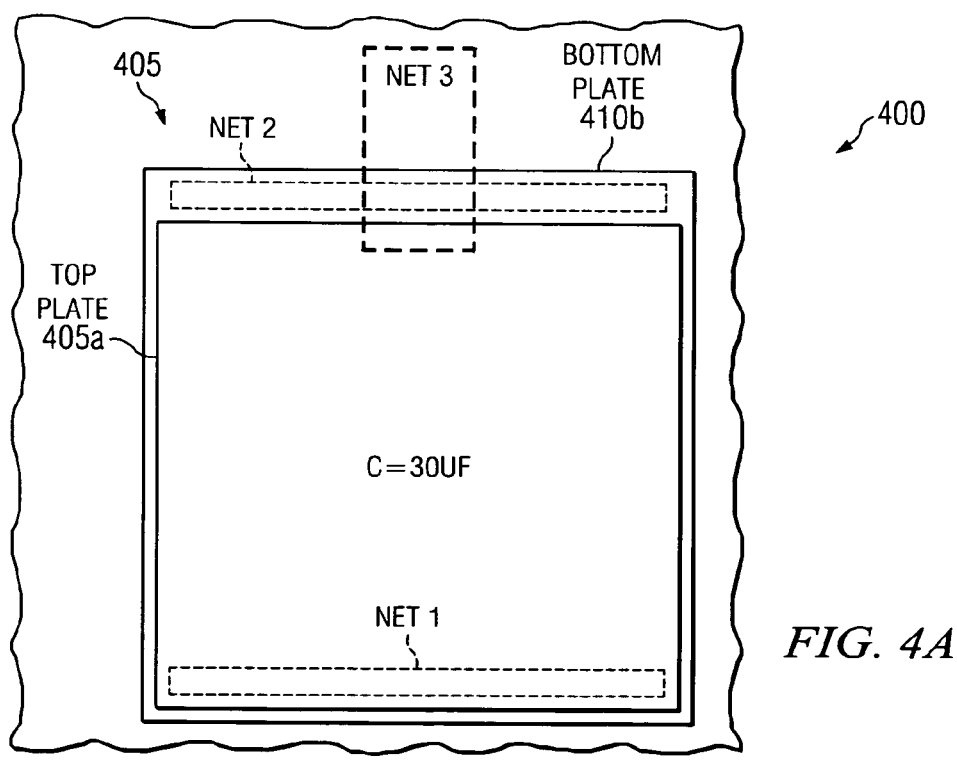

Turning now to FIGS. 4A and 4B, illustrated are a capacitor layout structure and an embodiment of a corresponding distributed parasitic network representing a distributed model, generally designated 400, 450, constructed in accordance with the principles of the present invention. The capacitor layout structure 400 includes a design device capacitor 405 having a top plate 405a connected to a first network connection NET1 and a bottom plate 405b connected to a second network connection NET2 that are fabricated on a substrate. The capacitor layout structure 400 also includes a third network connections NET3, also fabricated on the substrate, that does not directly connect to the design device capacitor 405 but forms part of its surrounding layout environment wherein it is positioned over a portion of the design device capacitor 405, as shown.

The distributed parasitic network 450 corresponds to a distributed model having allocated parasitic elements as may be provided by a distributed element generator or a method of generating distributed elements, as before. The distributed parasitic network 450 includes first, second and third distributed capacitances C1, C2, C3, first, second, third and fourth parasitic resistances $R_{P1}$, $R_{P2}$, $R_{P3}$, $R_{P4}$ and first, second, third, fourth and fifth parasitic capacitances $C_{P1}$, $C_{P2}$, $C_{P3}$, $C_{P4}$, $C_{P5}$. In the illustrated embodiment, the first, second and third distributed capacitances C1, C2, C3 have equal values whose sum corresponds to the capacitance of the design device capacitor 405.

As was generally discussed with respect to FIG. 3B, the first, second and third distributed capacitances C1, C2, C3, the first, second, third and fourth parasitic resistances $R_{P1}$, $R_{P2}$, $R_{P3}$, $R_{P4}$ and the first, second and third parasitic capacitances $C_{P1}$, $C_{P2}$, $C_{P3}$ provide a symmetrically distributed network corresponding to a design device capacitor that is isolated from the influence of the third network connection NET3. Connection of the fourth and fifth parasitic capacitances $C_{P4}$, $C_{P5}$ between this symmetrically distributed network and the third network connection NET3, as shown, accounts for its influence on the design device capacitor 405, which may also be quite significant. As before, selection of the parasitic resistance and capacitance values may be tailored to accommodate a particular simulation application.

Turning now to FIGS. 5A and 5B, illustrated are first and second resistor layout structures, generally designated 500, 550, having an interconnect crossing located in different positions thereby creating different leakage current profiles. Both of the first and second resistor layout structures 500, 550 employ the same design device resistor 505 employing first and second resistor heads HEAD1, HEAD2 and first, second and third network connections NET1, NET2, NET3 that are fabricated on a substrate. The first resistor head HEAD1 is connected to the first network connection NET1 employing a via, and the second resistor head HEAD2 is connected to the second network connection NET2 employing another via.

In the first resistor layout structure 500, the third network connection NET3 does not directly connect to the design device resistor 505 but forms part of its surrounding layout environment wherein it crosses the design device resistor 505 asymmetrically and nearer to the second network connection NET2. Analogously, in the second resistor layout structure 550, the third network connection NET3 also does not directly connect to the design device resistor 505 but forms part of its surrounding layout environment wherein it crosses the design device resistor 505 asymmetrically and nearer to the first network connection NET1. The influence afforded by the third network connection NET3 will clearly be greater on the second network connection NET2 in the first resistor layout structure 500 and greater on the first network connection NET1 in the second resistor layout structure 550.

Figure 6:
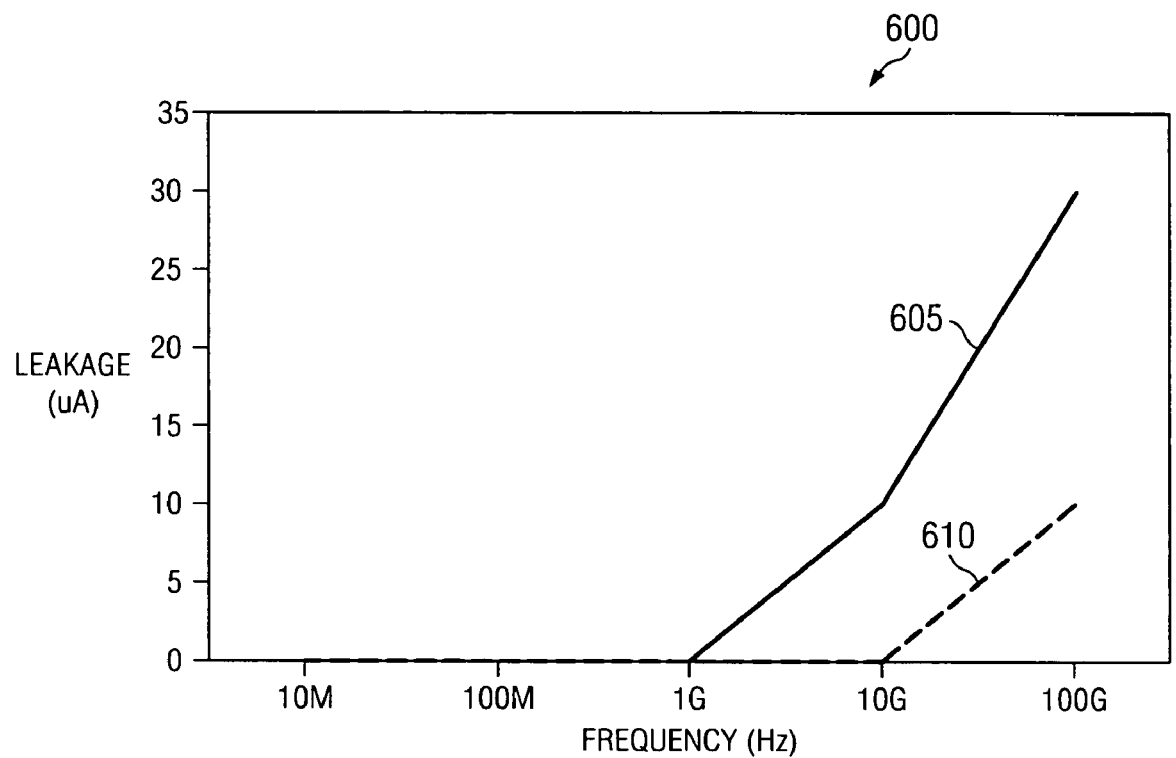
FIG. 6 illustrates a comparative chart of leakage currents for distributed models of the first and second resistor layout structures of FIGS. 5A and 5B.

Turning now to FIG. 6, illustrated is a comparative chart of leakage currents, generally designated 600, for distributed models of the first and second resistor layout structures of FIGS. 5A and 5B. These distributed models are based on the concepts presented with respect to FIGS. 3A and 3B. The comparative chart 600 includes a first leakage curve 605 and a second leakage curve 610. The first leakage curve 605 is representative of a leakage current between the third network connection NET3 and a corresponding nearest network connection. Analogously, the second leakage curve 610 is representative of a leakage current between the third network connection NET3 and a corresponding farthest network connection.

Therefore, the first leakage curve 605 represents the leakage current between the second and third network connections NET2, NET3 for the first resistor layout structure 500 and between the first and third network connections NET1, NET3 for the second resistor layout structure 550. Correspondingly, the second leakage curve 610 represents the leakage current between the first and third network connections NET1, NET3 for the first resistor layout structure 500 and between the second and third network connections NET2, NET3 for the second resistor layout structure 550.

The distributed models employed for the first and second resistor layout structures 500, 550 provide a more accurate simulation resulting in an appropriate separation of the first and second leakage curves 605, 610. This may be contrasted with a lumped parameter model, which would typically provide less separation for the two leakage curves or even cause them to converge into a single curve.

Figure 7:
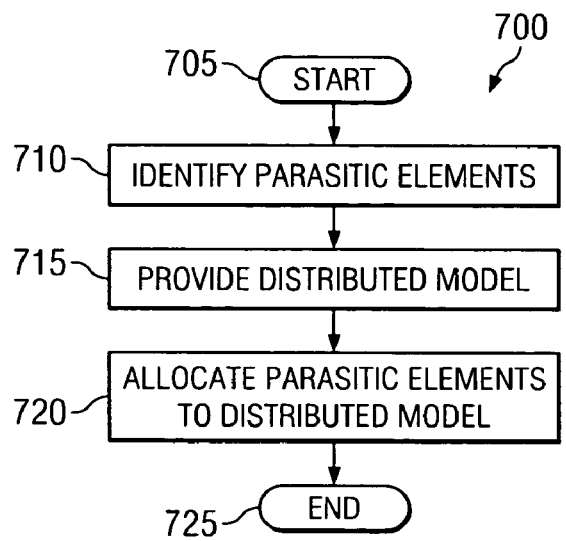
FIG. 7 illustrates a flow diagram of an embodiment of a method of generating distributed elements carried out in accordance with the principles of the present invention.

Turning now to FIG. 7, illustrated is a flow diagram of an embodiment of a method of generating distributed elements, generally designated 700, carried out in accordance with the principles of the present invention. The method 700 is for use an electronic design automation tool and starts in a step 705. Then, in a step 710, parasitic elements are identified that are associated with a passive integrated circuit device having a surrounding layout environment. The surrounding layout environment includes elements that are selected from the group consisting of an interconnect, a network node, a via, a substrate and another integrated circuit device. The parasitic elements are selected from a group consisting of a resistance, a capacitance and an inductance wherein the inductance is a separate inductance or a mutual inductance.

A distributed model of the passive integrated circuit device is provided in a step 715, and the parasitic elements are allocated within the distributed model based on the surrounding layout environment in a step 720. In allocating the parasitic elements in the step 720, they typically employ connection to interconnecting networks as well as to a substrate as deemed appropriate to a particular application. The distributed model employs ladder networks that generally contain series-coupled resistances and parallel-coupled capacitances as well as inductances that may be series-coupled or parallel-coupled. Additionally, the distributed model may employ a segmented interconnect having a resistivity corresponding to the passive integrated circuit device. The method ends in a step 725.

While the method disclosed herein has been described and shown with reference to particular steps performed in a particular order, it will be understood that these steps may be combined, subdivided, or reordered to form an equivalent method without departing from the teachings of the present invention. Accordingly, unless specifically indicated herein, the order or the grouping of the steps is not a limitation of the present invention.

In summary, embodiments of the present invention employing a distributed element generator, a method of generating distributed elements and an electronic design automation tool employing the generator or the method have been presented. Advantages include the ability to extract real parasitic information associated with the designed device for accurate simulation while maintaining the naming and electric network information. This allows both analysis and comparison to be accomplished on a head-to-head basis. Furthermore, this approach is seamless and automatic and happens without intervention or special steps being taken by a user thereby allowing more accurate analog simulations that result in enhanced analog components and designs, less product design rework and a shorter time to market. Additionally, existing procedures associated with standard practices employing existing design tools may be maintained and testing enhancements may be accommodated both economically and rapidly as appropriate to a particular application.

Although the present invention has been described in detail, those skilled in the art should understand that they can make various changes, substitutions and alterations herein without departing from the spirit and scope of the invention in its broadest form.

What is claimed is:

1. A distributed element generator for use with an electronic design automation tool, comprising:
   a parasitic element extractor configured to identify parasitic elements associated with an integrated circuit passive designed device having a surrounding layout environment; and
   a distributed parameter allocator coupled to said parasitic element extractor and configured to provide a distributed model of said integrated circuit passive designed device in which said passive designed device is divided into a plurality of segments and said parasitic elements are allocated relative to said segments within said distributed model based on relative physical location of said parasitic elements to said passive designed device in said surrounding layout environment.

2. The generator as recited in claim 1, wherein said integrated circuit passive designed device is selected from the group consisting of a resistor, a capacitor, an inductor, and a mutually-coupled inductor.

3. The generator as recited in claim 1, wherein said distributed model employs a ladder network having series-coupled resistances and parallel-coupled capacitances.

4. The generator as recited in claim 3, wherein said distributed model further employs a series-coupled inductance or a parallel-coupled inductance.

5. The generator as recited in claim 1, wherein said distributed model employs an interconnect having a resistivity corresponding to said integrated circuit passive design device.

6. The generator as recited in claim 1, wherein said surrounding layout environment includes an element selected from the group consisting of an interconnect, a network node, a via, a substrate, and another integrated circuit design device.

7. The distributed element generator of claim 1, further comprising providing a parametric representation of said designed device, by first extracting the designed device as a black box device and then replacing it with extracted information.

8. The distributed element generator of claim 1, wherein said passive designed device is divided into a plurality of three or more segments corresponding to physical segments of said designed device, and said parasitic elements are allocated based on their proximity relative to said physical segments.

9. The distributed element generator of claim 1, wherein said passive designed device is a resistor; and the distributed model divides said resistor into at least three segments having resistances whose sum equals the resistance of the designed device resistor.

10. The distributed element generator of claim 9, wherein said distributed model is a ladder network having series-coupled resistance and parallel-coupled capacitance, with the at least three segments being modeled as corresponding at least three series-coupled resistors, and said parasitic elements being modeled as capacitors distributed to connect to interconnections between pairs of said resistors according to physical locations of said parasitic elements relative to corresponding physical segments of said designed device resistor.

11. The distributed element generator of claim 10, wherein the designed device resistor employs first and second resistor heads and first, second and third network connections for fabrication on a substrate; the first and second resistor heads respectively connecting the first and second network connections; the third network connection forming a part of the surrounding layout environment that does not directly connect to the designed device resistor and crosses the designed device resistor asymmetrically and nearer to one of the first and second resistor heads; and wherein the distributed model models a parasitic element corresponding to the third network connection as a capacitor allocated asymmetrically to an interconnection of a pair of said resistors corresponding to a location nearer to said one head.

12. The distributed element generator of claim 1, wherein said passive designed device is a capacitor; and the distributed model divides said capacitor into at least three segments having parallel capacitances whose sum equals the capacitance of the designed device capacitor.

13. The distributed element generator of claim 12, wherein said distributed model is a ladder network having series-coupled resistances and parallel-coupled capacitances, with the at least three segments being modeled as corresponding at least three parallel-coupled capacitors, and said parasitic elements being modeled as resistors distributed to connect between pairs of said capacitors according to physical locations of said parasitic elements relative to corresponding physical segments of said designed device capacitor.

14. The distributed element generator of claim 13, wherein the designed device capacitor employs first and second capacitor plates and first, second and third network connections for fabrication on a substrate; the first and second capacitor plates respectively connecting the first and second network connections; the third network connection forming a part of the surrounding layout environment that does not directly connect to the designed device capacitor and that is positioned over the designed device capacitor asymmetrically; and wherein the distributed model models a parasitic element corresponding to the third network connection as a capacitance allocated asymmetrically corresponding to a location relative to a portion of the designed device capacitor.

15. The distributed element generator of claim 1, wherein said passive designed device is an inductor having a mutual inductance; and the distributed model divides said inductor into at least three segments having series-connected inductances and a mutually-couple inductance.

16. The distributed element generator of claim 15, wherein said distributed model is a ladder network having series-coupled resistances, parallel-coupled capacitances, series-coupled inductances and mutually-coupled inductance, with the at least three segments being modeled as corresponding at least three series-coupled inductors, and said parasitic elements being modeled as resistors, capacitors and mutual inductance distributed to connect to said inductors according to physical locations of said parasitic elements relative to corresponding physical segments of said designed device inductor.

17. The distributed element generator of claim 1, wherein said distributed model is a ladder network having series-coupled resistances, parallel-coupled capacitances, series-coupled and/or parallel-coupled inductances and mutually-coupled inductance.

18. A method of generating distributed elements for use with an electronic design automation tool, comprising:
identifying, via an electronic design automation tool, parasitic elements; in order to positively tie-in the apparatus aiding in performing the method associated with an integrated circuit passive designed device having a surrounding layout environment; and
providing a distributed model of said integrated circuit passive designed device, said providing including dividing said passive designed device into a plurality of segments and allocating said parasitic elements relative to said segments within said distributed model based on relative physical location of said parasitic elements to said passive designed device in said surrounding layout environment.

19. The method of claim 18, further comprising providing a parametric representation of said designed device, by first extracting the designed device as a black box device and then replacing it with extracted information.

20. The method of claim 18, wherein said passive designed device is divided into a plurality of three or more segments corresponding to physical segments of said designed device, and said parasitic elements are allocated based on their proximity relative to said physical segments.

21. The method of claim 18, wherein said passive designed device is a resistor; and the distributed model divides said resistor into at least three segments having resistances whose sum equals the resistance of the designed device resistor.

22. The method of claim 21, wherein said distributed model is a ladder network having series-coupled resistance and parallel-coupled capacitance, with the at least three segments being modeled as corresponding at least three series-coupled resistors, and said parasitic elements being modeled as capacitors distributed to connect to interconnections between pairs of said resistors according to physical locations of said parasitic elements relative to corresponding physical segments of said designed device resistor.

23. The method of claim 22, wherein the designed device resistor employs first and second resistor heads and first, second and third network connections for fabrication on a substrate; the first and second resistor heads respectively connecting the first and second network connections; the third network connection forming a part of the surrounding layout environment that does not directly connect to the designed device resistor and crosses the designed device resistor asymmetrically and nearer to one of the first and second resistor heads; and wherein the distributed model models a parasitic element corresponding to the third network connection as a capacitor allocated asymmetrically to an interconnection of a pair of said resistors corresponding to a location nearer to said one head.

24. The method of claim 18, wherein said passive designed device is a capacitor; and the distributed model divides said capacitor into at least three segments having parallel capacitances whose sum equals the capacitance of the designed device capacitor.

25. The method of claim 24, wherein said distributed model is a ladder network having series-coupled resistances and parallel-coupled capacitances, with the at least three segments being modeled as corresponding at least three parallel-coupled capacitors, and said parasitic elements being modeled as resistors distributed to connect between pairs of said capacitors according to physical locations of said parasitic elements relative to corresponding physical segments of said designed device capacitor.

26. The method of claim 25, wherein the designed device capacitor employs first and second capacitor plates and first, second and third network connections for fabrication on a substrate; the first and second capacitor plates respectively connecting the first and second network connections; the third network connection forming a part of the surrounding layout environment that does not directly connect to the designed device capacitor and that is positioned over the designed device capacitor asymmetrically; and wherein the distributed model models a parasitic element corresponding to the third network connection as a capacitance allocated asymmetrically corresponding to a location relative to a portion of the designed device capacitor.

27. The method of claim 18, wherein said passive designed device is an inductor having a mutual inductance; and the distributed model divides said inductor into at least three segments having series-connected inductances and a mutually-couple inductance.

28. The method of claim 27, wherein said distributed model is a ladder network having series-coupled resistances, parallel-coupled capacitances, series-coupled inductances and mutually-coupled inductance, with the at least three segments being modeled as corresponding at least three series-coupled inductors, and said parasitic elements being modeled as resistors, capacitors and mutual inductance distributed to connect to said inductors according to physical locations of said parasitic elements relative to corresponding physical segments of said designed device inductor.

29. The method of claim 18, wherein said distributed model is a ladder network having series-coupled resistances, parallel-coupled capacitances, series-coupled and/or parallel-coupled inductances and mutually-coupled inductance.

30. An electronic design automation tool, comprising:
a layout versus schematic module;
a resistance-capacitance extraction module that is coupled to the layout versus schematic module; and
a distributed element generator that is coupled to the resistance-capacitance extraction module, including:
a parasitic element extractor that identifies parasitic elements associated with an integrated circuit passive designed device having a surrounding layout environment; and
a distributed parameter allocator, coupled to said parasitic element extractor, that provides a distributed model of said integrated circuit passive designed device in which said passive designed device is divided into a plurality of segments and said parasitic elements are allocated relative to said segments within said distributed model based on relative physical location of said parasitic elements to said passive designed device in said surrounding layout environment.

31. The design automation tool of claim 30, wherein the tool is further configured to provide a parametric representation of said designed device, by first extracting the designed device as a black box device and then replacing it with extracted information.

32. The design automation tool of claim 30, wherein said passive designed device is divided into a plurality of three or more segments corresponding to physical segments of said designed device, and said parasitic elements are allocated based on their proximity relative to said physical segments.

33. The design automation tool of claim 30, wherein said passive designed device is a resistor; and the distributed model divides said resistor into at least three segments having resistances whose sum equals the resistance of the designed device resistor.

34. The design automation tool of claim 33, wherein said distributed model is a ladder network having series-coupled resistance and parallel-coupled capacitance, with the at least three segments being modeled as corresponding at least three series-coupled resistors, and said parasitic elements being modeled as capacitors distributed to connect to interconnections between pairs of said resistors according to physical locations of said parasitic elements relative to corresponding physical segments of said designed device resistor.

35. The design automation tool of claim 34, wherein the designed device resistor employs first and second resistor heads and first, second and third network connections for fabrication on a substrate; the first and second resistor heads respectively connecting the first and second network connections; the third network connection forming a part of the surrounding layout environment that does not directly connect to the designed device resistor and crosses the designed device resistor asymmetrically and nearer to one of the first and second resistor heads; and wherein the distributed model models a parasitic element corresponding to the third network connection as a capacitor allocated asymmetrically to an interconnection of a pair of said resistors corresponding to a location nearer to said one head.

36. The design automation tool of claim 30, wherein said passive designed device is a capacitor; and the distributed model divides said capacitor into at least three segments having parallel capacitances whose sum equals the capacitance of the designed device capacitor.

37. The design automation tool of claim 36, wherein said distributed model is a ladder network having series-coupled resistances and parallel-coupled capacitances, with the at least three segments being modeled as corresponding at least three parallel-coupled capacitors, and said parasitic elements being modeled as resistors distributed to connect between pairs of said capacitors according to physical locations of said parasitic elements relative to corresponding physical segments of said designed device capacitor.

38. The design automation tool of claim 37, wherein the designed device capacitor employs first and second capacitor plates and first, second and third network connections for fabrication on a substrate; the first and second capacitor plates respectively connecting the first and second network connections; the third network connection forming a part of the surrounding layout environment that does not directly connect to the designed device capacitor and that is positioned over the designed device capacitor asymmetrically; and wherein the distributed model models a parasitic element corresponding to the third network connection as a capacitance allocated asymmetrically corresponding to a location relative to a portion of the designed device capacitor.

39. The design automation tool of claim 30, wherein said passive designed device is an inductor having a mutual inductance; and the distributed model divides said inductor into at least three segments having series-connected inductances and a mutually-couple inductance.

40. The design automation tool of claim 39, wherein said distributed model is a ladder network having series-coupled resistances, parallel-coupled capacitances, series-coupled inductances and mutually-coupled inductance, with the at least three segments being modeled as corresponding at least three series-coupled inductors, and said parasitic elements being modeled as resistors, capacitors and mutual inductance distributed to connect to said inductors according to physical locations of said parasitic elements relative to corresponding physical segments of said designed device inductor.

41. The design automation tool of claim 30, wherein said distributed model is a ladder network having series-coupled resistances, parallel-coupled capacitances, series-coupled and/or parallel-coupled inductances and mutually-coupled inductance.

\* \* \* \* \*